(12) United States Patent
Jentz et al.

(10) Patent No.: US 7,438,794 B2
(45) Date of Patent: Oct. 21, 2008

(54) METHOD OF COPPER ELECTROPLATING TO IMPROVE GAPFILL

(75) Inventors: David Jentz, Hillsboro, OR (US); Ramesh Viswanathan, Hillsboro, OR (US); Paul McGregor, Hillsboro, OR (US); Valery Dubin, Portland, OR (US); Rajiv Rastogi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 633 days.

(21) Appl. No.: 10/956,282

(22) Filed: Sep. 30, 2004

(65) Prior Publication Data

US 2006/0065536 A1 Mar. 30, 2006

(51) Int. Cl.
C25D 3/38 (2006.01)
C25D 5/00 (2006.01)
C25D 7/12 (2006.01)

(52) U.S. Cl. .................. 205/102; 205/123; 205/137; 205/296

(58) Field of Classification Search .................. 205/102
See application file for complete search history.

(56) References Cited

U.S. PATENT DOCUMENTS

2001/0015321 A1* 8/2001 Reid et al. .................. 205/103
2002/0036145 A1* 3/2002 Dubin et al. ................ 205/296
2002/0112964 A1* 8/2002 Gandikota et al. .......... 205/118

* cited by examiner

Primary Examiner—Susy Tsang-Foster
Assistant Examiner—William T Leader
(74) Attorney, Agent, or Firm—Blakely, Sokoloff, Taylor & Zafman LLP (57) ABSTRACT

A copper electroplating bath composition and a method of copper electroplating to improve gapfill are provided. The method of electroplating includes providing an aqueous electroplating composition, comprising copper, at least one acid, at least one halogen ion, an additive including an accelerating agent, a suppressing agent, and a suppressing-accelerating agent, and the solution and mixture products thereof; contacting a substrate with the plating composition; and impressing a multi-step waveform potential upon the substrate, wherein the multi-step waveform potential includes an entry step, wherein the entry step includes a first sub-step applying a first current and a second sub-step applying second current, the second current being greater than the first current. The accelerating agent is provided in concentration of greater than 1.5 ml/liter, the suppressing agent is provided in concentration of greater than 15 ml/liter, and the accelerating-suppressing agent is provided in concentration of greater than 10 ml/liter.

14 Claims, 6 Drawing Sheets

METHOD OF COPPER ELECTROPLATING TO IMPROVE GAPFILL

BACKGROUND

1. Field

The present invention relates to the field of electroplating, and more particularly to the application of electroplating to the fabrication of interconnect structures in semiconductor devices.

2. Description of Related Art

Figure 1:
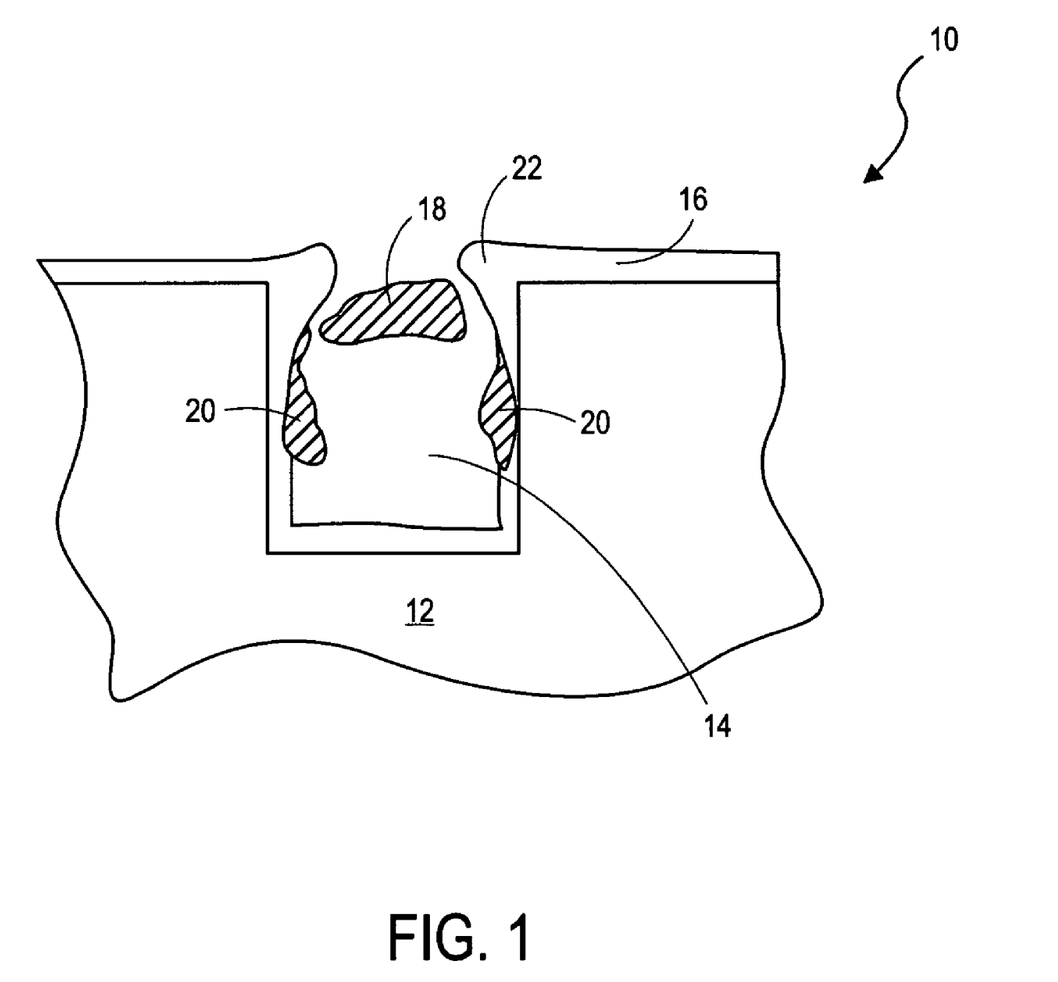
FIG. 1 is a cross-sectional view of a semiconductor structure, according to the prior art.

One phenomenon that is observed during semiconductor fabrication electroplating is the formation of defects such as voids in the metallization. A significant number of voids will result in a detrimentally lowered conductivity of a metallization such as a contact as well as poor electromigration resistance. In some cases, the void or voids may be sufficiently large to cause an open circuit and the device fails. FIG. 1 illustrates a semiconductor structure 10 including a substrate with a recess 14 therein. In FIG. 1, the recess 14 corresponds to a trench or a via. A seed layer 16 is located at the bottom and on the sidewalls of the recess 14.

Each successive process generation results, in general, in a reduction in the critical dimensions (CDs) of the metal linewidths and via diameters. The aspect ratio of a feature (height: width) and the step coverage of the barrier/seed (B/S) represent some of the critical parameters of the upstream processes that may impact gapfill at copper electroplating (Cu EP). Lateral seed encroachment into the feature may be referred to as B/S overhang. An overhang 22, illustrated in FIG. 1, effectively increases the aspect ratio by reducing the width of the recess 14 at the top compared to the width of the recess 14 at the bottom, which may result in a center void 18 at the top of the feature. A sidewall void 20 may occur if the Cu seed coverage at a particular location is too thin or non-existent. The defects illustrated in FIG. 1 have been observed where a known Cu EP process was applied to trenches and vias characterized by widths of less than 100 nanometers (sub-100 nm trenches and vias). Thus, FIG. 1 demonstrates the gapfill capability of a known Cu EP process.

As miniaturization of device features continues to progress, the possibility of forming voids in Cu interconnects increases and the electroplating process must be improved or modified to ensure void free gapfill.

SUMMARY

A copper electroplating bath composition and a method of copper electroplating to improve gapfill is described. According to one aspect, an aqueous electroplating composition is provided, including copper; at least one acid, selected from sulfuric, methane sulfonic, amidosulfuric, aminoacetic, fluoroboric, and mixtures thereof; at least one halogen; an accelerating agent, wherein concentration of the accelerating agent is greater than 1.5 ml/liter; a suppressing agent, wherein concentration of the suppressing agent is greater than 15 ml/liter; an accelerating-suppressing agent, wherein concentration of the accelerating-suppressing agent is greater than 10 ml/liter; and the solution and mixture products thereof.

According to a further aspect, a method of electroplating is provided, comprising: providing an aqueous electroplating composition, comprising copper, at least one acid, at least one halogen ion, an additive including an accelerating agent, a suppressing agent, and a suppressing-accelerating agent, and the solution and mixture products thereof; contacting a substrate with the plating composition; and impressing a multi-step waveform potential upon the substrate, wherein the multi-step waveform potential includes an entry step, wherein the entry step includes a first sub-step applying a first current and a second sub-step applying second current, the second current being greater than the first current.

According to a still further aspect, a ratio of the suppressing agent to the accelerating agent is between 8:1 and 10:1 and a ratio of the suppressing-accelerating agent to the accelerating agent is between 7:1 and 8:1.

Other features of the present invention will be apparent from the accompanying drawings and from the detailed description that follows.

BRIEF DESCRIPTION OF THE DRAWINGS

The embodiments of the present invention are illustrated by way of example and not limited by the accompanying drawings, in which like references indicate similar elements and in which.

DETAILED DESCRIPTION

In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive, as modifications may occur to those ordinarily skilled in the art. In other instances, well known semiconductor fabrication processes, techniques, materials, equipment, etc., have not been set forth in particular detail in order to not unnecessarily obscure embodiments of the present invention.

As metal linewidths and via diameters become smaller than 100 nanometers (nm), it may be necessary to optimize the Cu EP gapfill process, e.g., to enable 45 and 65 m technology nodes. (A technology node may be defined by the smallest device or circuit feature size.) The gap fill capability of Cu EP may be extended to feature dimensions below 100 nm by improving the rate of bottom-up fill, which is the process where Cu is deposited at the bottom of a recess at a faster rate than on the sides of the recess. In one exemplary embodiment, the bottom-up fill rate of the Cu EP process may be improved by optimizing concentrations of organic additives in the electroplating bath as well as by optimizing the multi-step waveform potential impressed upon the substrate.

High Organic Electroplating Bath

The bottom-up fill, as opposed to conformal deposition, may be achieved with the Cu EP bath utilizing organic additives, such as suppressors, anti-suppressors, and levelers. A suppressor, also referred to as a suppressing agent, decreases the rate of Cu deposition on an electrode surface. An anti-suppressor, also referred to as an accelerating agent or an accelerator, only accelerates or increases Cu deposition in the presence of a suppressor. A leveler, e.g., an accelerator-suppressor, may be utilized, for example, to act as an anti-suppressor at lower concentrations and as a suppressor at higher concentrations. The bottom-up fill rate of the electrochemical plating process may be improved by optimizing the concentrations of the organic additives.

In one exemplary embodiment, the Cu EP bath may be optimized for void free gapfill of sub-100 nanometers by utilizing an anti-suppressor, a suppressor, and a leveler, where the concentration of the accelerator is greater than or equal to 1.5 ml/liter and less than or equal to 4 ml/liter, the concentration of the suppressor is greater than or equal to 15 ml/liter and less than or equal to 30 ml/liter, and the concentration of the leveler is greater than or equal to 10 ml/liter and less than or equal to 30 ml/liter, as illustrated in Table 1.

TABLE 1

| Organic Additive | Optimized Bath Concentration (ml/liter) | Concentration Ratio (Additive concentration relative to accelerating agent concentration) |
|---|---|---|
| Accelerating agent | 1.5-4.0 | 1:1 |
| Suppressing agent | 15-30 | 8:1-10:1 |
| Leveler | 10-30 | 7:1-8:1 |

According to one exemplary embodiment, concentrations of all three additives are increased in comparison with a known Cu plating bath utilized for 100 nm and larger trenches and vias. In one embodiment, the concentrations of the suppressing agent and leveler are increased more significantly than that of the accelerating agent. The optimized Cu EP bath may be also characterized by concentration ratios between the accelerating agent and other additives. Table 1 illustrates the optimized ratios, according to one exemplary embodiment. Utilizing the modified chemistry illustrated in Table 1 may provide void free gapfill on the narrow trenches having widths of less than 100 nm.

The optimized Cu EP bath, preferably an aqueous electroplating composition, further includes copper, at least one acid, selected from sulfuric, methane sulfonic, amidosulfuric, aminoacetic, fluoroboric, and mixtures thereof and the like, and at least one halogen ion.

Accelerating agents may include a bath composition soluble disulfide or monosulfide organic compounds including their mixtures. One accelerating agent is SPS, 1-propane sulfonic acid, 3,3'-dithio-bis, di-sodium salt, that may include bis-(sodium-sulfopropyl)-disulfide as the di-sodium salt. Other accelerating agents may include:

1) 1-propanesulfonic acid, 3-[(ethoxy-thiomethyl)thio],- potassium salt;

2) a phosphonated disulfide; and 3) a sulphonated or a phosphonated monosulfide, such as 3-mercapto-1-propanesulfonic acid (MPS) or 2-Mercaptoethanesulfonic acid (MES).

In one embodiment, the aqueous electroplating bath composition uses an accelerating agent that is selected from a disulfide organic compound, a monosulfide organic compound, mixtures thereof, and the like. In a further embodiment, the accelerating agent includes SPS. In still further embodiment, the accelerating agent includes a phosphonated disulfide. In another embodiment, the accelerating agent is selected from a sulphonated monsulphide and a phosphonated monosulfide. In yet another embodiment, the accelerating agent is selected from 3-mercapto-1-propanesulfonic acid, and 2-mercaptoethanesulfonic acid sodium salt. The accelerating agent may also be selected from acylthioureas, thiocarboxylic acid amides, thiocarbamates, thiosemicarbazones, thiohydantoin, mixtures thereof, and the like. The accelerating agent may include (O-Ethyldithiocarbonato)-S-(3-sulfopropyl)-ester, potassium salt.

The suppressing agent, in one embodiment, includes a cross-linked polyamide. In another embodiment, the suppressing agent is selected from a polyether such as polyoxyethylene lauryl ether (POE). The suppressing agent may also be a glycol such as polyethylene glycol, polypropylene glycol, combinations thereof, and the like; or an aromatic compound such as alkoxylated beta-naphtol, alkyl naphthalene sulphonate, combinations, and the like. In yet another embodiment, the suppressing agent is selected from a polyether, a polyethylene, a naphtol, a sulphonate, a polyamine, a polyimid, and mixtures thereof.

In a further embodiment, the suppressing agent comprises a beta-naphtol having the structure:

wherein n may be equal to 1 and wherein m may be equal to 1. In a still further embodiment, the suppressing agent may also include polyethylene oxide. The suppressing agent may also be a nitrogen-containing compound such as polyimines, polyamids, combinations and the like. Additionally, the suppressing agent may be cross-combinations of any two up to all of ethers, glycols, double aromatics, polyethylenes, and nitrogen-containing compounds.

Suppressing-accelerating agents, utilized as leveler of Table 1, may include acid salts such as a bath soluble DPS, N,N-Dimethyl-dithiocarbamyl propyl sulfonic acid, sodium salt that may have the configuration (CH$_3$)$_2$N—S—C—S (CH$_2$)$_2$SO$_3$Na. In one embodiment, the accelerating-suppressing agent comprises DPS, N,N-dimethyl-dithiocarbamyl propyl sulfonic acid, sodium salt. DPS acts as an anti-suppressor at lower concentrations and as a suppressor at higher concentrations.

Optimized Waveform

Figure 1A:
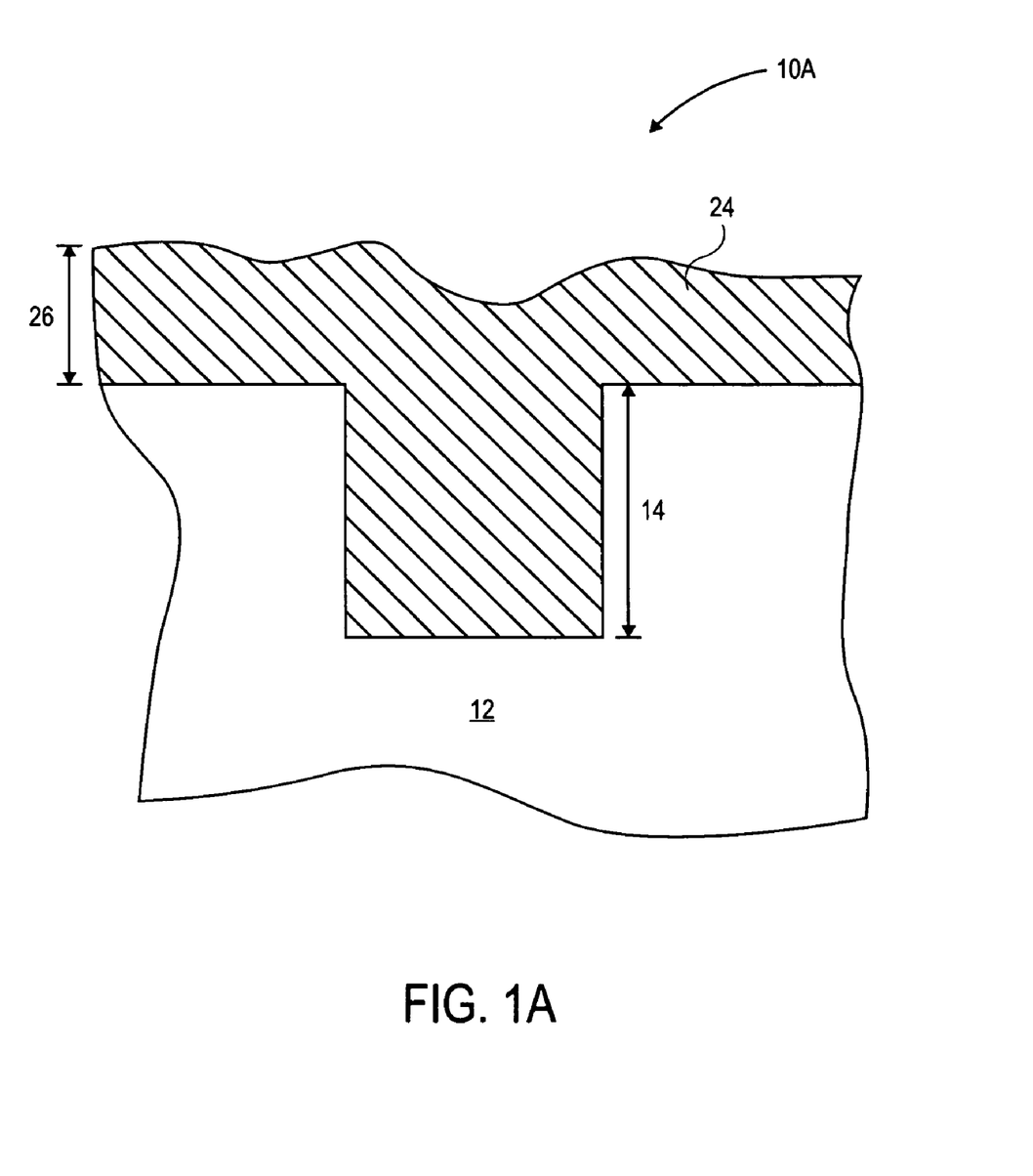
FIG. 1A is a cross-sectional view of a semiconductor structure, including an excess layer of Cu.

The bottom-up fill rate of Cu EP process, according to one exemplary embodiment, may be improved by optimizing the waveform potential impressed upon a substrate (e.g., a wafer) by removing low current conformal steps. An exemplary waveform includes an entry step, during which a wafer is being immersed into the EP solution; a superfill step, during which the bottom-up fill continues after the wafer has been completely immersed; and a bulk fill step, during which the final targeted thickness of an excess Cu layer is achieved. FIG. 1A illustrates a semiconductor structure, wherein the recess 14 is filled during the entry step and the superfill step, and the Cu excess layer 26 is deposited during the bulk fill step. In one exemplary embodiment, bottom-up fill starts during the entry step.

Figure 2:
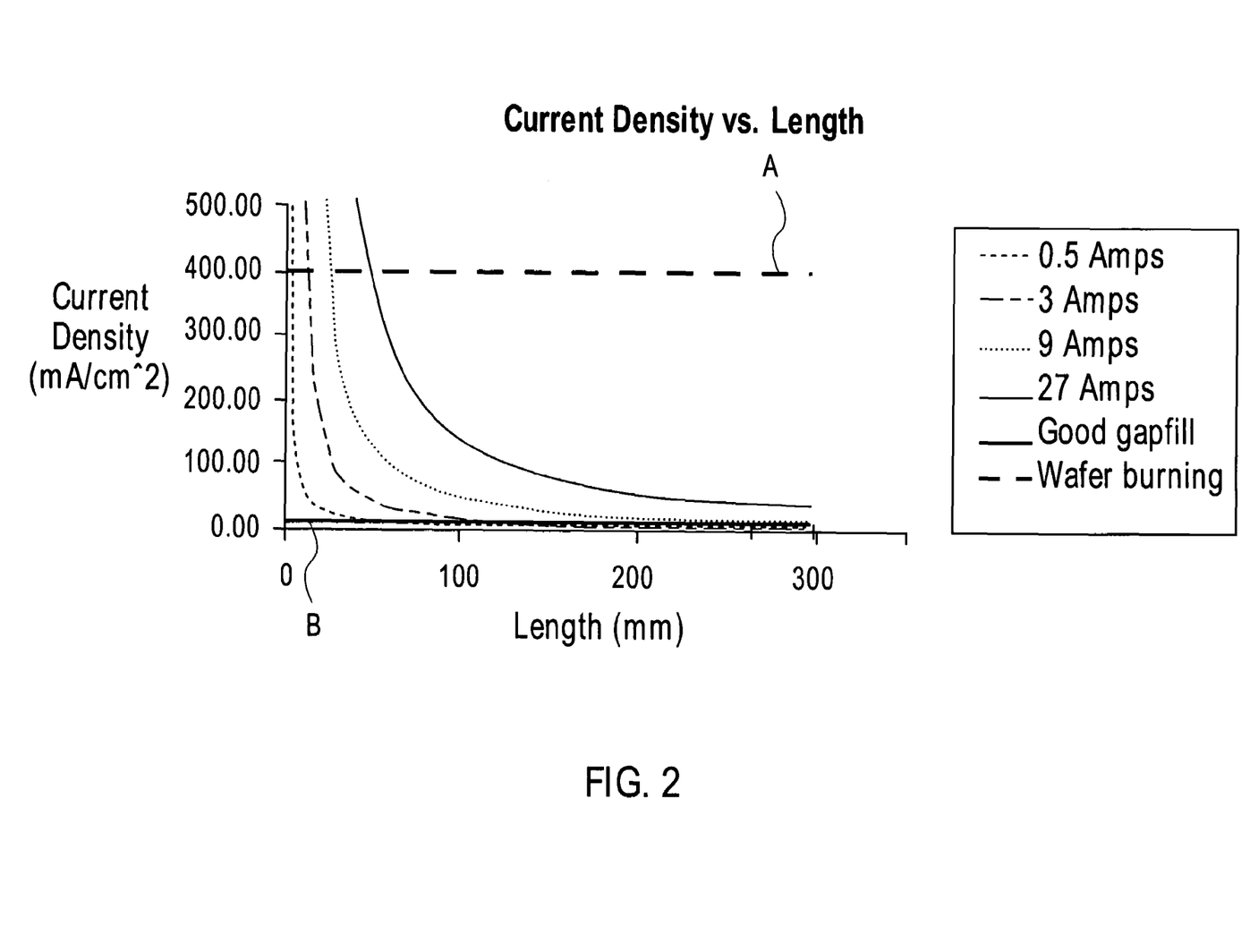
FIG. 2 illustrates a series of constant current entry curves, plotted as current density versus wafer length.
Figure 3:
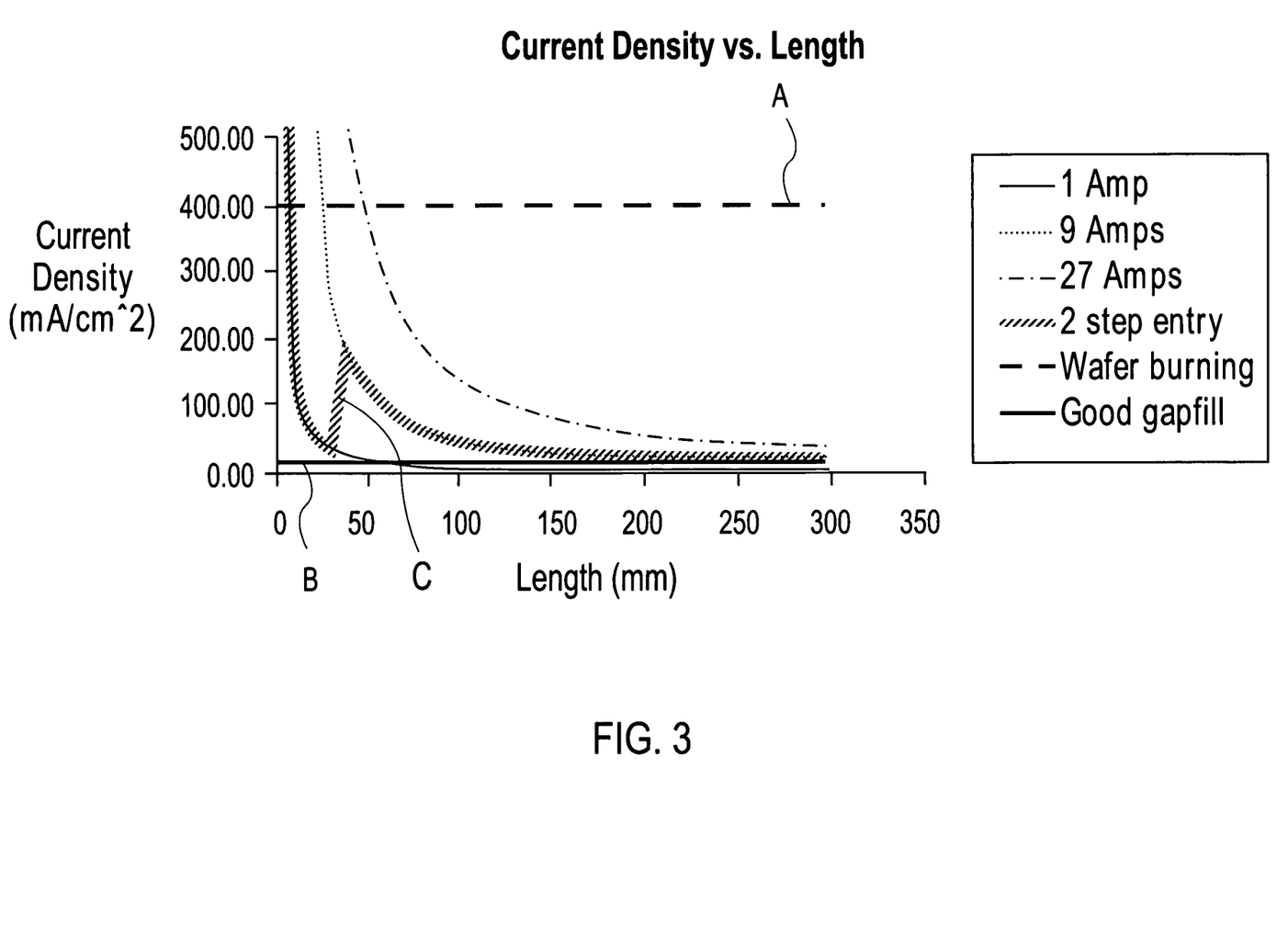
FIG. 3 illustrate a multi-step entry waveform where the power supply starts at a low current and increases to a higher current, according to an embodiment of the present invention.

Utilizing constant current during the entry step may result in wafer burning at high constant current and in poor gapfill at low constant current, especially on trenches and vias characterized by sub-100 nm dimensions. The challenge is to find a constant current that provides good gapfill without wafer burning and has a reasonable process window. FIG. 2 illustrates a series of constant current entry curves, plotted as current density versus wafer length. As the leading edge of a wafer (0 mm on the plot) enters the electroplating bath, the surface area of the immersed wafer is very small, and therefore the current density on the immersed portion of the wafer is very high. The current density decreases roughly as one over the immersion length squared. In FIG. 2, line A, represents the current density above which wafer burning occurs (the current density of about 400 mA/cm$^2$). It will be noted, that line A in FIGS. 2 and 3 is provided for illustration only, as the actual value for the current density above which wafer burning occurs may depend on the plating bath composition. It has been observed that the bottom-up fill rate may increase when a current density through the immersed portion of a wafer is increased. In FIG. 2, line B represents the threshold above which good gapfill may occur (the current density of about 4 mA/cm$^2$). It will be noted, that line B in FIGS. 2 and 3 is provided for illustration only, as the actual value for the current density above which good gapfill occurs may depend on the plating bath composition.

As can be seen on FIG. 2, when a constant current of 0.5 Amperes is applied to a wafer, the current density drops from above 400 mA/cm$^2$ to below 4 mA/cm$^2$ (a good gapfill threshold) before even a quarter of the wafer length is immersed, which results in poor gapfill. On the other hand, when a constant current of 9 Amperes is applied to the wafer, the current density remains above 400 mA/cm$^2$ (the wafer burning threshold) for a longer period of time, which results in burning of the wafer edge.

It is desirable to optimize the waveform such that it results in void free gapfill and at the same time does not result in significant wafer burning. It may be possible to construct a waveform that employs constant current entry that is capable of filling sub-100 nm trenches and vias without burning the wafer. Another solution may include optimizing the waveform to approximate constant current density on the immersed portion of the wafer within a desirable range. A particular current density that may provide a maximum bottom-up fill rate may be identified for a given EP process.

In one exemplary embodiment, substantially constant current density may be achieved by starting the EP process at a low current, and then increasing the current as the wafer is being immersed into the plating solution, such that the entry step includes one or more sub steps. This technique, which may be referred to as a multi-step entry waveform, may approximate constant current density within the desirable current density range, which, in turn, may result in good gapfill without significant wafer burning. The implementation of such a technique may be affected by the time of wafer immersion (e.g., the time of wafer immersion may be on the order of one second) and the switching capability of the power supply. An example of a two-step entry waveform is represented by line C in FIG. 3. Line C illustrates the current switched from a low constant current of 1 Ampere to a higher constant current of 9 Amperes during the entry step. Thus, FIG. 3 illustrates the entry step as a combination of a low current step of 1 Ampere and a higher current step of 9 Amperes. The waveform represented by line C does not cause the burning of the edge of the wafer and at the same time results in good gapfill.

Figure 3A:
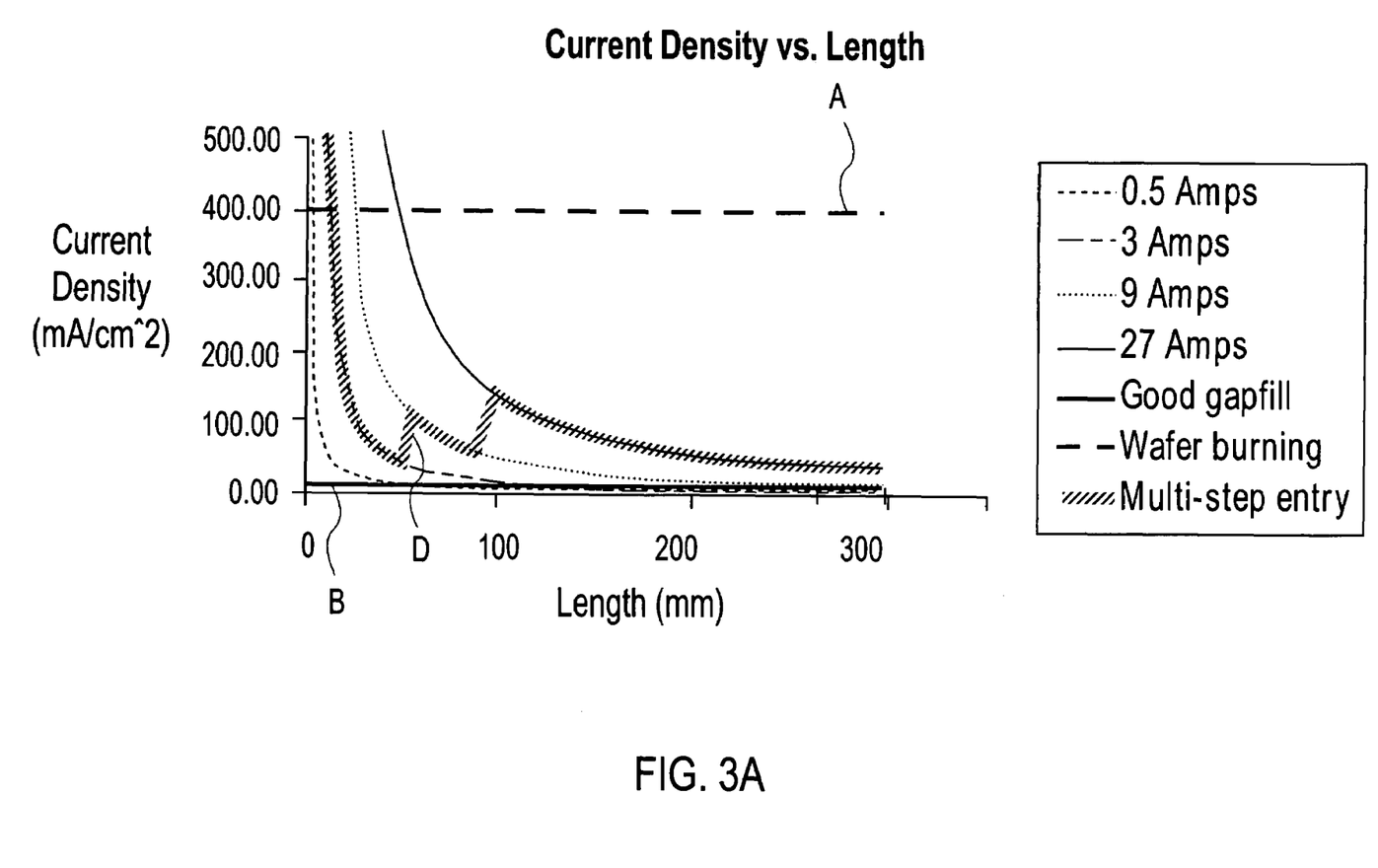
FIG. 3A illustrate a multi-step entry waveform where the power supply starts at a low current and successively increases to higher currents, according to a further embodiment of the present invention.

It will be noted that although FIG. 3 illustrates a two step entry process, an entry process including more than two sub steps may be utilized to achieve a closer approximation of constant current density. An example of a three-step entry waveform is represented by line D in FIG. 3A. Line D illustrates that, during the entry step, the current is first switched from a low constant current of 3 Amperes to a higher constant current of 9 Amperes first, and then to a still higher current of 27 Amperes. Similarly, depending on a particular EP process, the number of entry step sub steps may be increased further, in order to approximate a desirable current density to a higher degree.

Table 2 demonstrates detailed exemplary waveforms including an entry step, a superfill step, and a bulk step. The entry step, which may be composed of multiple sub steps as described above, uses current in the range of 3-14 Amperes for a 300 mm wafer. For example, the entry step, in one embodiment, may commence utilizing the current of 4 Amperes, then, as the wafer is being immersed into the plating solution, the current may be increased to 5 Amperes, then to 8 Amperes, and, finally, to 13 Amperes. This multi-step entry may result in maintaining the current density during the portion of the entry step characterized by bottom up fill below a wafer burning threshold (e.g., 400 mA/cm$^2$ as illustrated in FIG. 2) and above good gap fill threshold (e.g., 4 mA/cm$^2$ as illustrated in FIG. 2). The current used during the entry step may be referred to as an entry current. The duration of the entry step, which may be referred to as entry time, may be in the range of 0.1-2 seconds. It will be noted that entry time may vary depending on specific EP process and on specific wafer configuration.

The superfill step, as shown in Table 2, is performed such that the current density is maintained in the range of 4-20 mA/cm$^2$. The current density for the superfill step in Table 2 is the current averaged over the entire wafer after full immersion. It will be noted that superfill time may vary depending on specific EP process and on specific wafer configuration. Using a waveform with an entry current in the range of 3-14 Amperes and a superfill current density in the range of 4-20 mA/cm$^2$ may yield void-free gapfill for vias and trenches.

The bulk step, as shown in Table 2, is performed such that the current density is maintained in the range of 35-60 mA/cm$^2$. The duration of the bulk fill step may be determined by the final targeted thickness of the Cu excess layer 26 (illustrated in FIG. 1A).

TABLE 2

| | Entry Current (A) | Entry Time (s) | Superfill Current Density (mA/cm$^2$) | Superfill Time (s) | Bulk Current Density (mA/cm$^2$) | Bulk Time (s) |
|---|---|---|---|---|---|---|
| Waveform | 3-14 | 0.1-2 | 4-20 | 1-35 | 35-60 | x |

High Organic High Current Process

The optimized waveforms of Table 2 may be utilized in combination with the optimized Cu EP bath described above, which may further improve the bottom-up fill rate of the electrochemical plating process. A process utilizing both the chemistry described in Table 1 in combination with the waveform illustrated in Table 2, which may be referred to as a high organic high current density process, may result in good gapfill on both sub-100 nm trenches and sub-100 nm vias.

Figure 4:
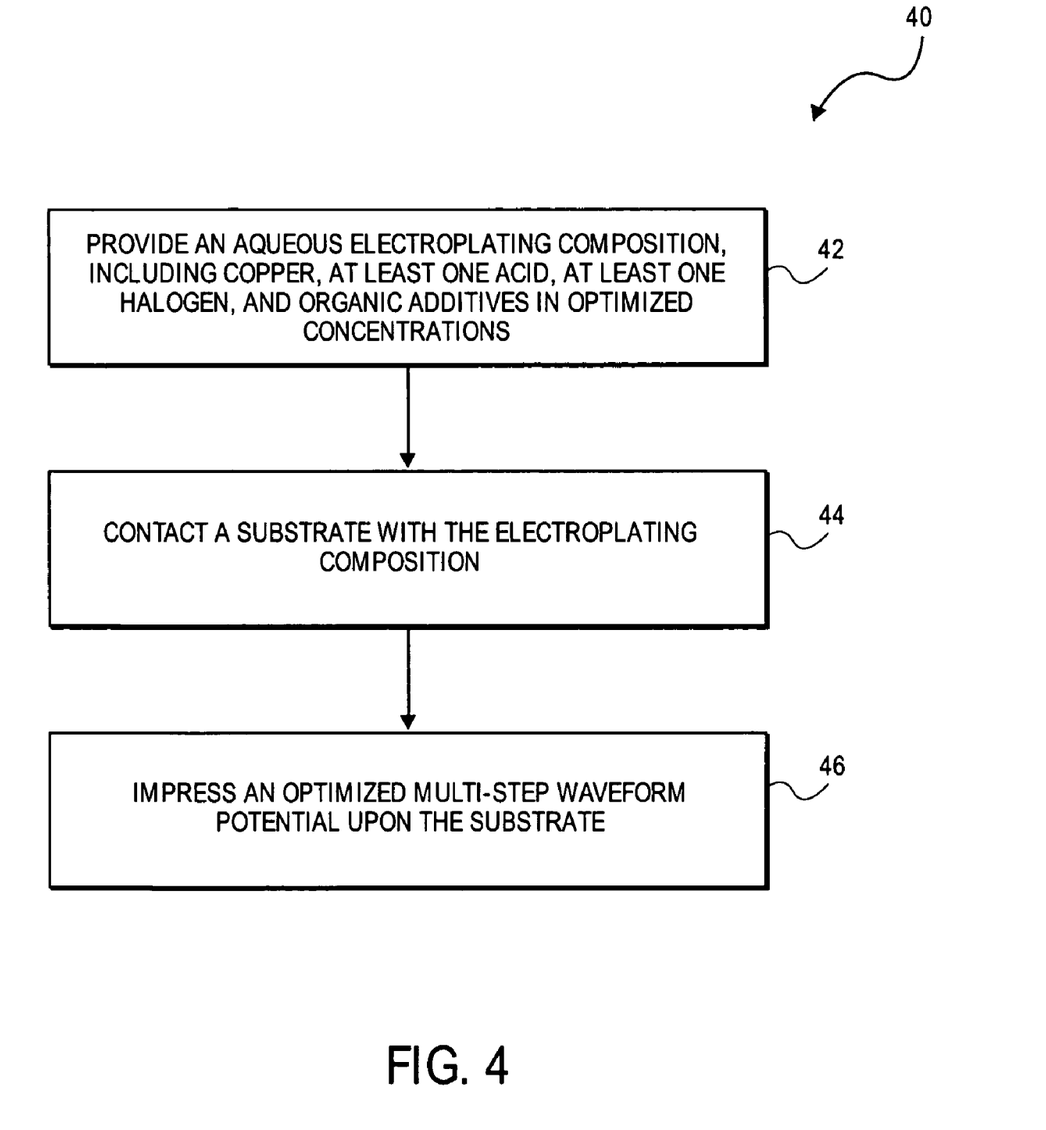
FIG. 4 is a flowchart illustrating a method to improve gapfill of narrow trenches and vias, according to an embodiment of the present invention.

FIG. 4 is a flowchart illustrating a method 40 to improve gapfill of narrow trenches and vias, according to an embodiment of the present invention. At block 42, an aqueous electroplating composition is provided, including copper, at least one acid, at least one halogen, and organic additives in optimized concentrations. At block 44, a substrate (e.g., a wafer) is contacted with the electroplating composition. An optimized multi-step waveform potential is impressed upon the substrate at block 46. The method 40 may result in improved gapfill of narrow trenches and vias. It will be noted that the operation of block 46 may be performed simultaneously with the operation of block 44. In one exemplary embodiment, a waveform potential is applied to the aqueous electroplating composition before contacting the substrate therewith.

Thus, a method and a plating bath composition to improve gapfill of trenches and vias have been described. Although the method and the plating bath composition to improve gapfill have been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The invention claimed is:

1. A method of electroplating comprising:
   providing an aqueous electroplating composition, comprising:
      copper,
      at least one acid,
      at least one halogen ion,
      an additive including an accelerating agent, a suppressing agent, and a suppressing-accelerating agent, and
      the solution and mixture products thereof;
   contacting a substrate with the electroplating composition; and
   impressing a multi-step waveform potential upon the substrate, wherein the multi-step waveform potential includes an entry step of immersing the substrate in the electroplating composition, wherein the entry step includes a first sub-step of applying a first constant current while immersing a first length of the substrate and a second sub-step following the first sub-step of applying a second constant current while immersing a second length of the substrate, the second constant current being greater than the first constant current.

2. The method of electroplating according to claim 1, wherein the first constant current is greater than or equal to 3 Amperes.

3. The method of electroplating according to claim 1, wherein the second constant current is less than or equal to 14 Amperes.

4. The method of electroplating according to claim 1, wherein the multi-step waveform potential includes a superfill step performed at a current density of greater than or equal to 4 mA/cm2.

5. The method of electroplating according to claim 4, wherein the superfill step is performed at a current density of less than or equal than 20 mA/cm2.

6. The method of electroplating according to claim 1, wherein the impressing of a multi-step waveform potential upon the substrate further includes applying a potential upon the aqueous electroplating composition before contacting the substrate therewith.

7. A method of electroplating including:
   providing an aqueous electroplating composition, including:
      copper,
      at least one acid,
      at least one halogen ion,
      an accelerating agent, wherein concentration of the accelerating agent is greater than 1.5 ml/liter,
      a suppressing agent, wherein concentration of the suppressing agent is greater than 15 ml/liter,
      an accelerating-suppressing agent, wherein concentration of the accelerating-suppressing agent is greater than 10 ml/liter, and
      the solution and mixture products thereof;
   contacting a substrate with the aqueous electroplating composition; and
   impressing a multi-step waveform potential upon the substrate, wherein the multi-step waveform potential includes an entry step of immersing the substrate in the electroplating composition, wherein the entry step includes a first sub-step of applying a first constant current while immersing a first length the substrate and a second sub-step following the first sub-step of applying a second constant current while immersing a second length the substrate, the second constant current being greater than the first constant current.

8. The method of electroplating according to claim 7, wherein a ratio of the suppressing agent to the accelerating agent is between 8:1 and 10:1.

9. The method of electroplating according to claim 7, wherein a ratio of the suppressing-accelerating agent to the accelerating agent is between 7:1 and 8:1.

10. A method of electroplating comprising:
    providing an aqueous electroplating composition;
    contacting a substrate with the electroplating composition; and
    impressing a multi-step waveform potential upon the substrate, wherein the multi-step waveform potential includes an entry step of immersing the substrate in the electroplating composition, wherein the entry step includes applying a first constant current while immersing a first length of the substrate, and then applying a second constant current while immersing a second length of the substrate, the second constant current being greater than the first constant current.

11. The method of electroplating according to claim 10, wherein the electroplating composition comprises:
    copper,
    at least one acid,
    at least one halogen ion,
    an additive including an accelerating agent, a suppressing agent, and a suppressing-accelerating agent, and
    the solution and mixture products thereof.

12. The method of electroplating according to claim 11, further comprising electroplating copper into a feature on the substrate, wherein the feature has a width of less than 100 nanometers.

13. The method of electroplating according to claim 11, wherein a metal is deposited onto the substrate during the entry step.

14. The method of electroplating according to claim 11, wherein the first and second constant currents are positive currents.

* * * * *